(12) United States Patent
Park et al.

(10) Patent No.: US 10,527,231 B2
(45) Date of Patent: Jan. 7, 2020

(54) LIGHT EMITTING PACKAGE AND VEHICLE LIGHTING DEVICE COMPRISING SAME

(71) Applicant: LG INNOTEK CO., LTD., Seoul (KR)

(72) Inventors: Jin Gyeong Park, Seoul (KR); Won Jin Kim, Seoul (KR); In Jae Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/773,909

(22) PCT Filed: Nov. 4, 2016

(86) PCT No.: PCT/KR2016/012683
§ 371 (c)(1),
(2) Date: May 4, 2018

(87) PCT Pub. No.: WO2017/078474
PCT Pub. Date: May 11, 2017

(65) Prior Publication Data
US 2018/0335182 A1    Nov. 22, 2018

(30) Foreign Application Priority Data
Nov. 6, 2015    (KR) .......................... 10-2015-0155764

(51) Int. Cl.
*H01L 33/50*    (2010.01)
*F21K 9/20*    (2016.01)
(Continued)

(52) U.S. Cl.
CPC .............. *F21K 9/20* (2016.08); *F21S 41/176* (2018.01); *F21S 43/145* (2018.01); *F21S 43/30* (2018.01);
(Continued)

(58) Field of Classification Search
None
See application file for complete search history.

(56) References Cited

U.S. PATENT DOCUMENTS

| 2007/0001182 | A1* | 1/2007 | Schardt ................ C09K 11/02 257/98 |
| 2008/0116467 | A1 | 5/2008 | Mueller et al. |

(Continued)

FOREIGN PATENT DOCUMENTS

| EP | 2 357 677 A1 | 8/2011 |
| JP | 2009-538955 A | 11/2009 |

(Continued)

OTHER PUBLICATIONS

International Search Report in International Application No. PCT/KR2016/012683, filed Nov. 4, 2016.
(Continued)

*Primary Examiner* — Andrew J Coughlin
(74) *Attorney, Agent, or Firm* — Saliwanchik, Lloyd & Eisenschenk

(57) ABSTRACT

Embodiments of the present invention relate to a light emitting package having excellent light extraction efficiency and thermal stability, the light emitting package comprising: a light emitting unit; a photo-conversion substrate arranged on one surface of the light emitting unit; and an adhesive member arranged between the light emitting unit and the photo-conversion substrate, and comprising inorganic nanoparticles dispersed in a silicone-based resin.

8 Claims, 3 Drawing Sheets

(51) Int. Cl.
  H01L 33/56    (2010.01)
  F21S 43/145   (2018.01)
  F21S 43/30    (2018.01)
  H01L 23/00    (2006.01)
  H01L 33/60    (2010.01)
  F21S 41/176   (2018.01)
  F21Y 115/15   (2016.01)

(52) U.S. Cl.
  CPC ............. *H01L 24/48* (2013.01); *H01L 33/50* (2013.01); *H01L 33/56* (2013.01); *H01L 33/60* (2013.01); *F21Y 2115/15* (2016.08); *H01L 33/505* (2013.01); *H01L 2224/48091* (2013.01); *H01L 2224/49113* (2013.01); *H01L 2224/49175* (2013.01); *H01L 2933/0091* (2013.01)

(56) References Cited

U.S. PATENT DOCUMENTS

2009/0206301 A1   8/2009   Verschuuren et al.
2009/0256166 A1*  10/2009  Koike .................. H01L 33/501
                                                      257/98
2012/0126274 A1   5/2012   Jagt et al.
2013/0003347 A1*  1/2013   Maemura ............. H01L 33/507
                                                      362/84

FOREIGN PATENT DOCUMENTS

| JP | 2010-510650 A | 4/2010 |
| KR | 10-2012-0032780 A | 4/2012 |
| KR | 10-2013-0128420 A | 11/2013 |
| KR | 10-2015-0096179 A | 8/2015 |
| WO | WO-2004/074885 A1 | 9/2004 |
| WO | WO-2007/138502 A2 | 12/2007 |
| WO | WO-2008/096214 A2 | 8/2008 |

OTHER PUBLICATIONS

Supplementary Partial European Search Report dated Dec. 14, 2018 in European Application No. 16862489.8.

* cited by examiner

LIGHT EMITTING PACKAGE AND VEHICLE LIGHTING DEVICE COMPRISING SAME

CROSS-REFERENCE TO RELATED APPLICATIONS

This application is the U.S. national stage application of International Patent Application No. PCT/KR2016/012683, filed Nov. 4, 2016, which claims priority to Korean Application No. 10-2015-0155764, filed Nov. 6, 2015, the disclosures of each of which are incorporated herein by reference in their entirety.

TECHNICAL FIELD

The present invention relates to a light-emitting package having improved light extraction efficiency and a vehicle lighting device including the same.

BACKGROUND ART

In light-emitting devices (e.g., light-emitting diodes (LEDs)) used recently, light extraction efficiency has become an important research issue in terms of energy efficiency.

Further, an energy conversion ratio in LED chips is about 15% or less, and the remaining 85% of electric energy is converted into thermal energy and consumed, so heat dissipation is very significant.

In order to solve a problem of heat dissipation, a thickness of a phosphor plate has been increased, thereby lowering light extraction efficiency.

DISCLOSURE

Technical Problem

Embodiments of the present invention are devised to solve the above-described problems and provide a light-emitting package having improved light extraction efficiency and a vehicle lighting device including the same.

Technical Solution

Embodiments of the present invention provide a light-emitting package including a light-emitting unit; a photo-conversion substrate disposed on one surface of the light-emitting unit; and an adhesive member disposed between the light-emitting unit and the photo-conversion substrate and including inorganic nanoparticles dispersed in a silicone-based resin.

Advantageous Effects

According to an embodiment of the present invention, inorganic nanoparticles dispersed in a silicone-based resin are applied to a light-emitting package of the present invention and a vehicle lighting device including the light-emitting package to improve a refractive index of an adhesive member. Thus, a luminous flux of the entire light-emitting package is increased, and thermal stability thereof is improved.

MODES OF THE INVENTION

Figure 1:
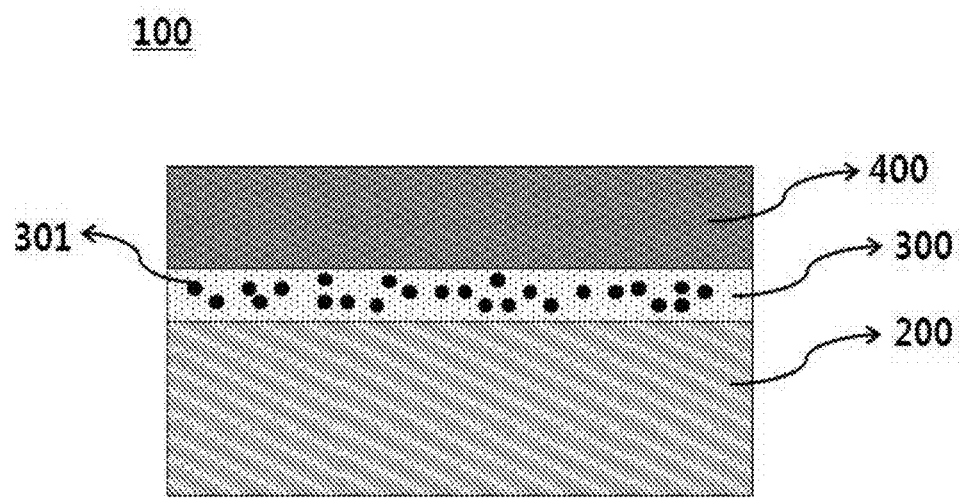
FIG. 1 is a cross-sectional view of a light-emitting package manufactured according to an exemplary embodiment of the present invention.

Exemplary embodiments of the present invention that can be easily implemented by one skilled in the art will now be described more fully with reference to the accompanying drawings in which the exemplary embodiments of the invention are shown. However, an embodiment described herein and components shown in the drawings are only an exemplary embodiment of the present invention, and it should be understood that various equivalents and modifications could be made thereto at the time of filing of the present application. Further, in the following detailed description of operating principles of exemplary embodiments of the present invention, a detailed description of known functions and configurations incorporated therein will be omitted so as not to unnecessarily obscure embodiments of the present invention. The following terms are defined in consideration of functions in the present invention, and the meanings of the respective terms should be interpreted based on contents of the entire present specification.

As shown in FIG. 1, a light-emitting package 100 according to an embodiment of the present invention may have a structure in which a light-emitting unit 200, an adhesive member 300, and a photo-conversion substrate 400 are sequentially stacked. The light-emitting unit 200 may be any one selected from a light-emitting diode (LED), an organic LED (OLED), a laser diode (LD), a laser, and a vertical-cavity surface-emitting laser (VCSEL). Effects of high light extraction efficiency and thermal stability according to the present invention are more suitable for LEDs.

The adhesive member 300 may be interposed and formed between the light-emitting unit 200 and the photo-conversion substrate 400. The adhesive member 300 may include inorganic nanoparticles 301 dispersed in a silicone-based resin. An ethyl-based, butyl-based, or methyl-based resin or a phenyl-based silicone-based resin may be used as the silicone-based resin. A metal silicone may maintain a high refractive index and thermal stability.

Inorganic nanoparticles, which are dispersed in a silicone-based resin, and particularly, a methyl silicone resin to maintain thermal stability and have a high refractive index, may be used as the inorganic nanoparticles 301 capable of maintaining thermal stability and having a high refractive index. Test results according to an embodiment of the present invention revealed that $TiO_2$ or $ZrO_2$ inorganic nanoparticles and inorganic nanoparticles including $TiO_2$ or $ZrO_2$ maintained high thermal stability and exhibited excellent light extraction effects.

The adhesive member 300 may be formed to have a high refractive index of nearly 1.6 by dispersing $TiO_2$ or $ZrO_2$ inorganic nanoparticles 301 in the silicone-based resin. Due to the high refractive index, the adhesive member 300 may effectively improve light extraction without optical loss between the light-emitting unit 200 having a refractive index of about 2.4 and being disposed under the adhesive member 300 and the photo-conversion substrate 400 having a refractive index of about 1.6 and being stacked on the adhesive member 300. When the adhesive member 300 has a refractive index of about 2.0, which is intermediate between 1.6 and 2.4, it would be ideal for light extraction. However, when a resin adhesive member is used, it is practically impossible to achieve a refractive index as high as 2.0. This is because even a resin adhesive having a high refractive index, from among presently known resin adhesives, has a refractive index of about 1.4. In addition, even if a resin adhesive has a high refractive index, since the resin adhesive needs attendant thermal stability, a polymer resin that may simultaneously satisfy both a high refractive index and thermal stability may be a silicone-based resin, and particularly, a methyl silicone resin, which is an embodiment of the present invention.

However, since the methyl silicone resin also has a refractive index of about 1.41, there is a limit to improving light extraction efficiency only by using a methyl silicone itself. Thus, according to an embodiment of the present invention, when inorganic nanoparticles 301 are used in a certain amount, a refractive index of the adhesive member 300 may be increased and thermal stability and a high refractive index may be obtained. To this end, the inorganic nanoparticles 301 included in the adhesive member 300 may include, for example, at least one material selected from the group consisting of titanium dioxide ($TiO_2$) sol, strontium titanate ($SrTiO_3$) sol, zinc sulfide (ZnS), selenium sulfide (ZnSe), potassium bromide (KBr), silver chloride (AgCl), magnesium oxide (MgO), cerium iodide (CeI), cerium bromide (CsBr), calcium carbonate ($CaCO_3$), phosphorus tribromide ($PBr_3$), trichlorobenzene ($C_6H_3Cl_3$), naphthalene ($C_{18}H_{15}Cl$), thiochroman-4-one, thionyl bromide ($SOBr_2$), zinc oxide (ZnO), cerium oxide ($CeO_2$), indium tin oxide (ITO) sol, tantalum oxide ($Ta_2O_5$), titanium peroxide ($Ti_2O_5$), titanium suboxide ($Ti_2O_3$), zirconium oxide ($ZrO_2$), bromine ($Br_2$), carbon disulfide ($CS_2$), $ZrO_2$—$TiO_2$-based sol, and a $SiO_2$—$Fe_2O_3$-based compound. Particularly, the inorganic nanoparticles 301 included in the adhesive member 300 may include nanoscale $TiO_2$ and nanoscale zirconium oxide, that is, zirconia ($ZrO_2$).

$TiO_2$ preferably has a particle size of 50 nm to 200 nm, and $ZrO_2$ preferably has a particle size of 10 nm to 150 nm. When the particle sizes of $TiO_2$ and $ZrO_2$ were less than the above-mentioned ranges, the inorganic particles were not properly dispersed due to severe agglomeration of the inorganic particles. When the particle sizes of $TiO_2$ and $ZrO_2$ exceeded the above-mentioned ranges, refractive-index increasing effects were insufficient. Table 1 shows results obtained by testing light extraction (luminous flux) effects using $TiO_2$ having a particle size of 100 nm. An adhesive member was prepared by dispersing $TiO_2$ in a methyl silicone resin according to content of Table 1. Thereafter, a light-emitting package was manufactured by interposing the adhesive member between an LED light-emitting unit and a photo-conversion substrate including yttrium aluminum garnet (YAG) phosphor. Thus, the light-emitting package was tested.

TABLE 1

| $TiO_2$ content | No. | Luminous flux [lm] | Cx | Cy | CCT [K] |
| --- | --- | --- | --- | --- | --- |
| 0 wt % | 1 | 281.32 | 0.3039 | 0.2977 | 7466 |
|  | 2 | 286.35 | 0.3041 | 0.2957 | 7490 |
|  | 3 | 290.18 | 0.3091 | 0.3052 | 6962 |
|  | 4 | 291.75 | 0.308 | 0.3007 | 7104 |
|  | Average | 287.4 | 0.3063 | 0.2998 | 7256 |

TABLE 1-continued

| $TiO_2$ content | No. | Luminous flux [lm] | Cx | Cy | CCT [K] |
| --- | --- | --- | --- | --- | --- |
| 0.05 wt % | 1 | 290.62 | 0.3073 | 0.3048 | 7093 |
|  | 2 | 294.59 | 0.3089 | 0.3075 | 6946 |
|  | 3 | 290.32 | 0.3119 | 0.3115 | 6703 |
|  | 4 | 288.81 | 0.3099 | 0.3053 | 6906 |
|  | Average | 291.1 | 0.3095 | 0.3073 | 6912 |
| 0.1 wt % | 1 | 281.71 | 0.31 | 0.3052 | 6900 |
|  | 2 | 276.14 | 0.3058 | 0.2987 | 7301 |
|  | 3 | 295.95 | 0.3076 | 0.3062 | 7052 |
|  | 4 | 289.96 | 0.313 | 0.3136 | 6613 |
|  | Average | 285.9 | 0.3091 | 0.3059 | 6967 |
| 0.3 wt % | 1 | 289.04 | 0.3083 | 0.3064 | 7001 |
|  | 2 | 285.7 | 0.3099 | 0.3062 | 6894 |
|  | 3 | 279.67 | 0.3076 | 0.3039 | 7085 |
|  | 4 | 279.83 | 0.3074 | 0.3041 | 7097 |
|  | Average | 283.6 | 0.3083 | 0.3052 | 7019 |

Figure 2:
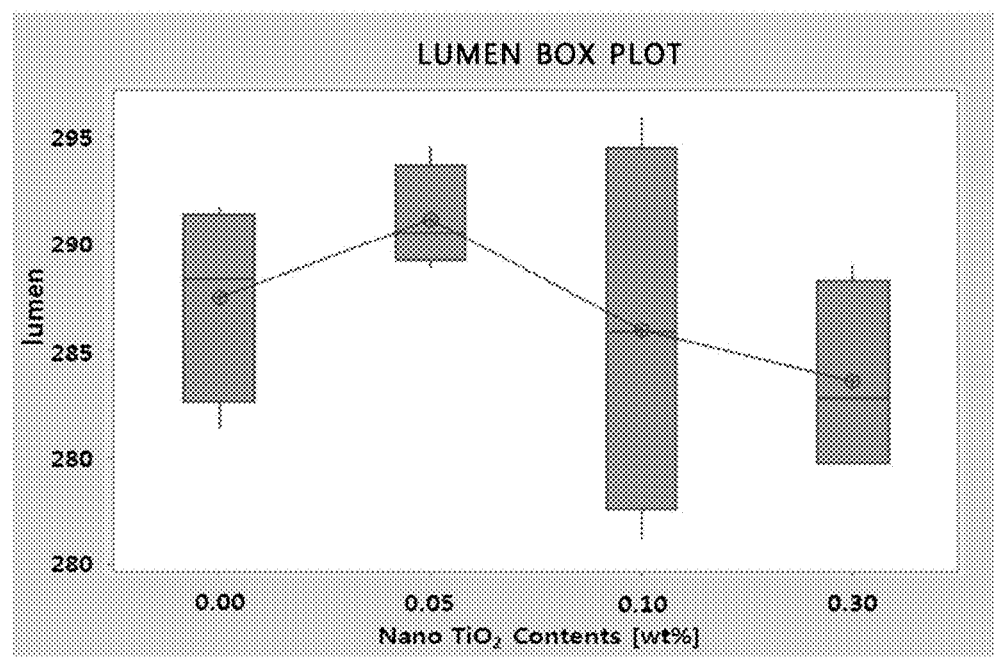
FIG. 2 is a graph showing a variation in luminous flux of a light-emitting package relative to a $TiO_2$ content according to an embodiment of the present invention.

Referring to Table 1 and FIG. 2, it can be seen that when a $TiO_2$ content was 0.05 wt %, a luminous flux was highest and increased 1.3% to 2.6% compared to other test conditions. Further, it can be seen that when the $TiO_2$ content exceeded 0.05 w %, the luminous flux sharply dropped. These results show that the nanoscale $TiO_2$ content percentage affects the luminous flux of the light-emitting package at a trace level.

Table 2 shows results obtained by testing luminous fluxes using $ZrO_2$ having a particle size of 50 nm under the same experimental conditions as those of $TiO_2$.

TABLE 2

| $ZrO_2$ content | No. | Luminous flux [lm] | Cx | Cy | CCT [K] |
| --- | --- | --- | --- | --- | --- |
| 0 wt % | 1 | 297.8 | 0.320 | 0.331 | 6107 |
|  | 2 | 291.9 | 0.319 | 0.329 | 6194 |
|  | 3 | 293.3 | 0.319 | 0.331 | 6149 |
|  | 4 | 295.2 | 0.321 | 0.333 | 6042 |
|  | Average | 294.6 | 0.320 | 0.331 | 6123 |
| 4.5 wt % | 1 | 287.6 | 0.313 | 0.322 | 6552 |
|  | 2 | 292.2 | 0.319 | 0.329 | 6188 |
|  | 3 | 291.5 | 0.319 | 0.329 | 6178 |
|  | 4 | 293.0 | 0.318 | 0.328 | 6211 |
|  | Average | 291.1 | 0.317 | 0.327 | 6282 |
| 9 wt % | 1 | 293.1 | 0.320 | 0.335 | 6090 |
|  | 2 | 296.1 | 0.323 | 0.340 | 5946 |
|  | 3 | 301.6 | 0.325 | 0.341 | 5829 |
|  | 4 | 313.7 | 0.325 | 0.332 | 5856 |
|  | Average | 301.1 | 0.323 | 0.337 | 5930 |
| 13.5 wt % | 1 | 291.4 | 0.316 | 0.320 | 6414 |
|  | 2 | 292.0 | 0.316 | 0.320 | 6392 |
|  | 3 | 291.6 | 0.316 | 0.320 | 6399 |
|  | 4 | 291.7 | 0.316 | 0.320 | 6398 |
|  | Average | 291.7 | 0.316 | 0.320 | 6401 |
| 18 wt % | 1 | 284.8 | 0.322 | 0.335 | 6015 |
|  | 2 | 291.4 | 0.322 | 0.330 | 6034 |
|  | 3 | 272.0 | 0.315 | 0.323 | 6422 |
|  | 4 | 293.3 | 0.319 | 0.328 | 6188 |
|  | Average | 285.4 | 0.319 | 0.329 | 6165 |

Figure 3:
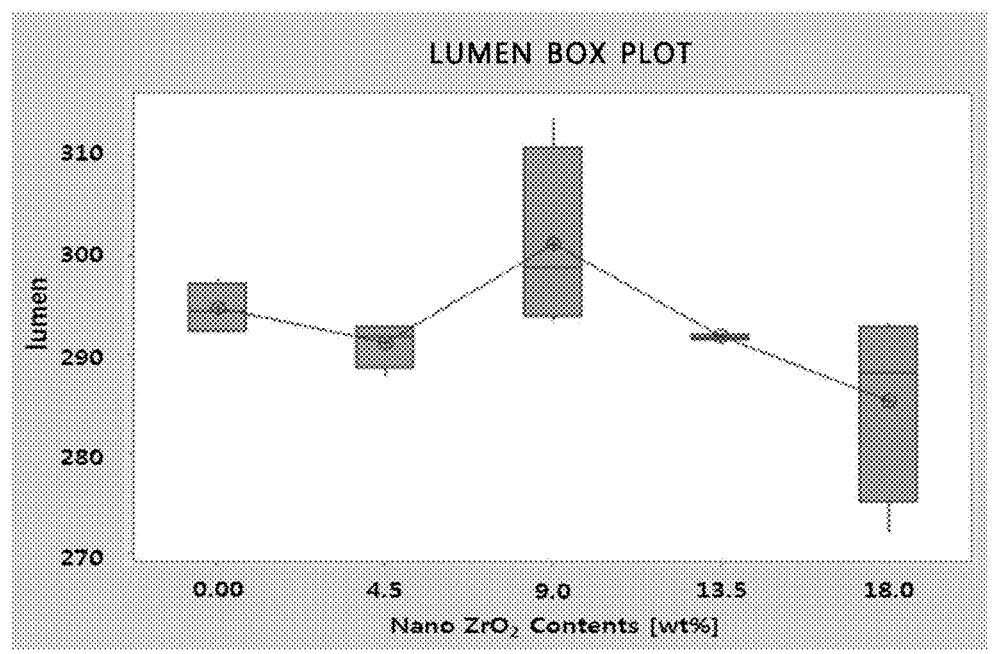
FIG. 3 is a graph showing a variation in luminous flux of a light-emitting package relative to a $ZrO_2$ content according to an embodiment of the present invention.

Referring to Table 2 and FIG. 3, it can be seen that when a $ZrO_2$ content was 9 wt %, a luminous flux was highest and increased 2.1% to 5.2% compared to other test conditions. Further, it can be seen that when the $ZrO_2$ content was less than or exceeded 9 wt %, the luminous flux rapidly dropped. These results show that the nanoscale $ZrO_2$ content affects the luminous flux of the light-emitting package.

Referring to color temperatures of Table 2, it can be seen that when the $ZrO_2$ content was 9 wt %, the color temperature was 5930 K, which was the result closest to 5700 K which is a color temperature of natural light (sunlight). For light, being similar to a color temperature of natural light signifies being easier for the naked human eye to recognize and to reduce eye fatigue.

It was determined that a rise in the luminous flux of the light-emitting package 100 was a result of an increase in the refractive index of the adhesive member 300. Thus, a refractive index of the adhesive member alone was measured to be about 1.58 to 1.62. Thus, it can be inferred that the refractive index of the adhesive member was equal to or higher than a refractive index of a photo-conversion substrate including inorganic phosphor.

The photo-conversion substrate 400 according to the embodiment of the present invention may include a fluorescent material. Although a substrate formed of various light-transmissive materials may be applied to the photo-conversion substrate 400, a ceramic substrate may be applied to the photo-conversion substrate 400 in an exemplary embodiment of the present invention.

Figure 4:
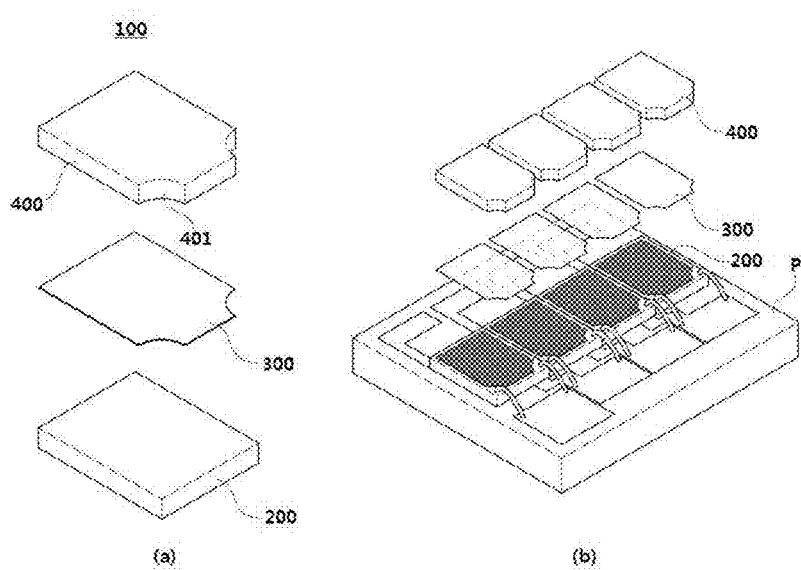
FIGS. 4 and 5 are conceptual diagrams of a light-emitting package manufactured according to an embodiment of the present invention and a printed circuit board (PCB) to which the light-emitting package is applied.
Figure 5:
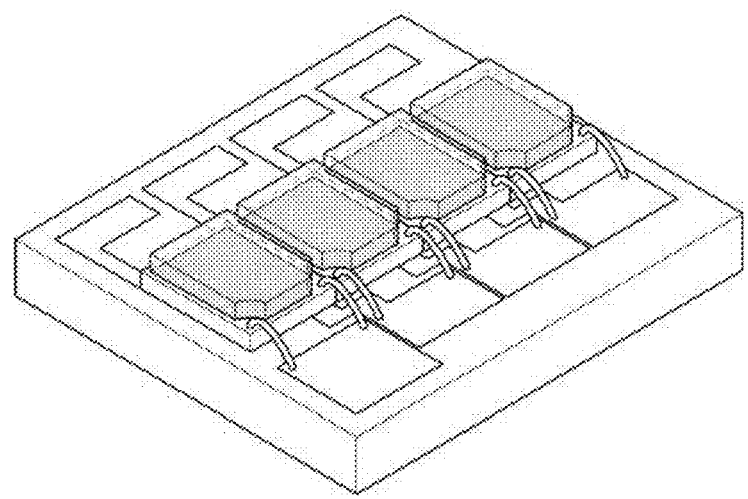

The fluorescent material included in the photo-conversion substrate 400 may include phosphorus (P) capable of converting excitation light of various light-emitting units 200 into converted light through the medium of phosphor, and the phosphor. Specifically, the fluorescent material may include at least one of yellow phosphor, green phosphor, and red phosphor. The yellow phosphor emits light having a main wavelength in the range of 540 nm to 585 nm in response to blue light (430 nm to 480 nm), and the green phosphor emits light having a main wavelength in the range of 510 nm to 535 nm in response to blue light (430 nm to 480 nm). The red phosphor emits light having a main wavelength in the range of 600 nm to 650 nm in response to blue light (430 nm to 480 nm). The yellow phosphor may be silicate-based or YAG-based phosphor, the green phosphor may be silicate-based, nitride-based, or sulfide-based phosphor, and the red phosphor may be nitride-based or sulfide-based phosphor. FIG. 4A is a conceptual diagram of a light-emitting package 100 according to an embodiment of the present invention, and FIG. 4B is a conceptual diagram of the light-emitting package 100 before the light-emitting package 100 is mounted on a printed circuit board (PCB) P. FIG. 5 shows a state in which the light-emitting package is mounted on a PCB.

As can be seen from FIG. 4A, the light-emitting package 100 may be configured such that an adhesive member 300 is disposed between a light-emitting unit 200 and a photo-conversion substrate 400. Groove units 401 serving as paths for wires configured to electrically connect the PCB P with the light-emitting unit 200 may be formed in the photo-conversion substrate 400 and the adhesive member 300. The light-emitting unit 200 may be any one selected from an LED, an OLED, an LD, a laser, and a VCSEL. Particularly, the light-emitting package 100 manufactured according to the present invention may achieve high thermal stability and light extraction efficiency when an LED light source is used.

Figure 6:
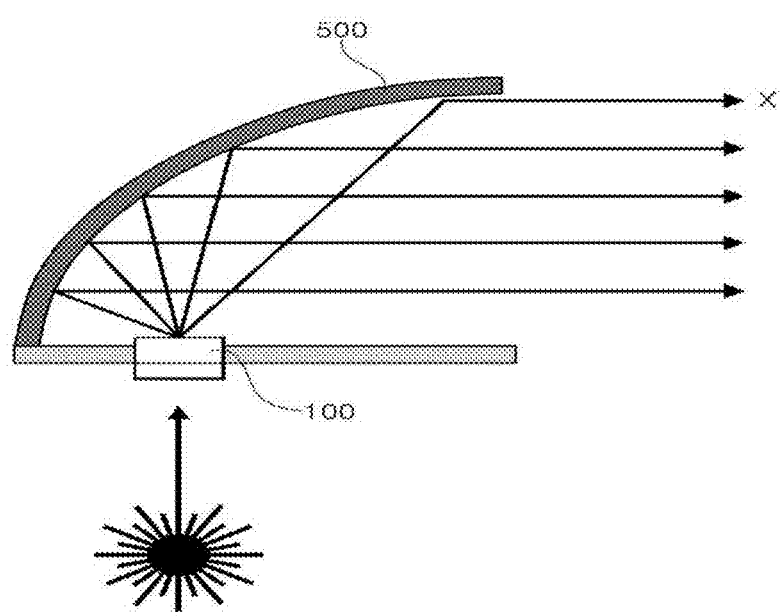
FIG. 6 is a conceptual diagram of a vehicle lighting device to which a light-emitting package manufactured according to an embodiment of the present invention is applied.

FIG. 6 is a conceptual diagram of a vehicle lighting device to which a light-emitting package 100 according to an embodiment of the present invention is applied. Light converted by a photo-conversion substrate of the light-emitting package 100 proceeds to a reflector 500 and is emitted in an X direction. A reflective member (not shown) is disposed on a rear surface of the light-emitting package 100 so that converted light proceeding to the light-emitting package 100 may be partially reflected, return to the reflector 500, and be emitted.

Further, in the present invention, a light-emitting unit may be disposed on a PCB. A photo-conversion substrate may be disposed on the light-emitting unit. An adhesive member may be disposed between the light-emitting unit and the photo-conversion substrate. Although not shown in the present invention, a transparent substrate may be disposed between the light-emitting unit and the adhesive member. The light-emitting unit may be in contact with or spaced apart from the transparent substrate. The transparent substrate may be a metal oxide substrate, a sapphire substrate, or a plastic substrate. In the present invention, the light-emitting unit may be used interchangeably with a concept including a transparent substrate.

A plurality of light-emitting units may be provided. The light-emitting unit may include a light source mounted on a substrate, and a plurality of light sources may be provided. The plurality of light sources may be disposed on a plurality of photo-conversion substrates or a single photo-conversion substrate. Further, the adhesive member disposed between the light-emitting unit and the photo-conversion substrate may be also disposed between the photo-conversion substrate and the photo-conversion substrate.

The photo-conversion substrate may be in contact with the light-emitting unit or spaced apart from the light-emitting unit.

While specific embodiments have been described in the above detailed description of the present invention, various changes in form and details may be made to the embodiments without departing from the spirit and scope of the present invention. The technical spirit of the present invention should not be limited to the above-described embodiments of the present invention but should be defined by the following claims and the equivalents thereof.

| Explanation of symbols | |
|---|---|
| 100: light-emitting package | 200: light-emitting unit |
| 300: adhesive member | 301: inorganic nanoparticles |
| 400: photo-conversion substrate | 500: reflector |

The invention claimed is:

1. A light-emitting package comprising:
a light-emitting unit;
a photo-conversion substrate disposed on one surface of the light-emitting unit; and
an adhesive member disposed between the light-emitting unit and the photo-conversion substrate, the adhesive member comprising inorganic nanoparticles dispersed in a silicone-based resin,
wherein a refractive index of the adhesive member is higher than a refractive index of the photo-conversion substrate,
wherein a difference in refractive index between the adhesive member and the photo-conversion substrate is 0.8 or less,
wherein the silicone-based resin is a phenyl silicone resin, and
wherein the inorganic nanoparticles comprise titanium dioxide ($TiO_2$), wherein the inorganic nanoparticles have particle sizes in a range between 50 nm to 200 nm and are configured to have a content of 0.04% to 0.06% by weight in the adhesive member such that a maximum luminous flux of the light-emitting package is achieved.

2. The light-emitting package of claim 1, wherein a refractive index of the adhesive member is 1.58 to 1.62.

3. The light-emitting package of claim 1, wherein the inorganic nanoparticles have particle sizes of 100 nm and are configured to have a content of 0.05% by weight in the adhesive member, and
wherein the adhesive member has a color temperature in a range between 6703 K and 7093 K.

4. The light-emitting package of claim 1, wherein the inorganic nanoparticles comprise $ZrO_2$, and the $ZrO_2$ has particle sizes of 10 nm to 150 nm and is dispersed with a content of 7 to 11.5% by weight in the adhesive member.

5. A vehicle lighting device comprising:
a light-emitting package comprising a light-emitting unit, a photo-conversion substrate disposed on one surface of the light-emitting unit, and an adhesive member disposed between the light-emitting unit and the photo-conversion substrate, the adhesive member comprising inorganic nanoparticles dispersed in a silicone-based resin; and
a reflector configured to reflect converted light emitted by the light-emitting package;
wherein a difference in refractive index between the adhesive member and the photo-conversion substrate is 0.8 or less, and
wherein the inorganic nanoparticles comprise titanium dioxide ($TiO_2$), wherein the inorganic nanoparticles have particle sizes in a range between 50 nm to 200 nm and are configured to have a content of 0.04% to 0.06% by weight in the adhesive member such that a maximum luminous flux of the light-emitting package is achieved.

6. The vehicle lighting device of claim 5, comprising a transparent substrate disposed between the light-emitting unit and the adhesive member.

7. A vehicle lighting device comprising:
a light-emitting unit;
a photo-conversion substrate disposed on one surface of the light-emitting unit;
an adhesive member disposed between the light-emitting unit and the photo-conversion substrate, the adhesive member comprising inorganic nanoparticles dispersed in a silicone-based resin;
a transparent substrate disposed between the light-emitting unit and the adhesive member, wherein the light-emitting unit is spaced apart from the transparent substrate; and
a support substrate comprising a groove in which the photo-conversion substrate is disposed, the support substrate being in contact with a reflector;
wherein the inorganic nanoparticles comprise titanium dioxide ($TiO_2$), wherein the inorganic nanoparticles have particle sizes in a range between 50 nm to 200 nm and are configured to have a content of 0.04% to 0.06% by weight in the adhesive member such that a maximum luminous flux of the light-emitting package is achieved.

8. The vehicle lighting device of claim 7, wherein a difference in refractive index between the adhesive member and the photo-conversion substrate is 0.8 or less.

* * * * *